United States Patent
Crowder et al.

(10) Patent No.: US 7,935,599 B2
(45) Date of Patent: May 3, 2011

(54) NANOWIRE TRANSISTOR AND METHOD FOR FORMING SAME

(75) Inventors: Mark A. Crowder, Portland, OR (US); Yutaka Takafuji, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 1034 days.

(21) Appl. No.: 11/732,675

(22) Filed: Apr. 4, 2007

(65) Prior Publication Data

US 2008/0248642 A1    Oct. 9, 2008

(51) Int. Cl.
*H01L 21/00* (2006.01)
*H01L 21/84* (2006.01)
*H01L 21/336* (2006.01)

(52) U.S. Cl. .. 438/283; 438/157; 438/284; 257/E21.635
(58) Field of Classification Search .................. 438/157, 438/283, 177, 284
See application file for complete search history.

(56) References Cited

U.S. PATENT DOCUMENTS

| | | | |
|---|---|---|---|
| 6,331,720 B1 * | 12/2001 | Parekh et al. | 257/308 |
| 6,664,196 B1 * | 12/2003 | Wada et al. | 438/754 |
| 7,029,959 B1 * | 4/2006 | Yang et al. | 438/164 |
| 2004/0166642 A1 * | 8/2004 | Chen et al. | 438/284 |
| 2006/0046483 A1 * | 3/2006 | Abatchev et al. | 438/689 |
| 2006/0172497 A1 * | 8/2006 | Hareland et al. | 438/286 |

OTHER PUBLICATIONS

Singh et al., High-Performance Fully Depleted Silicon Nanowire (Diameter < 5nm) Gate-All-Around CMOS Devices, IEEE Electron Device Letters, vol. 27, No. 5, May 2006, pp. 383.

* cited by examiner

*Primary Examiner* — Matthew C Landau
*Assistant Examiner* — Daniel Luke
(74) *Attorney, Agent, or Firm* — Law Office of Gerald Maliszewski; Gerald Maliszewski

(57) ABSTRACT

A method is provided for removing reentrant stringers in the fabrication of a nanowire transistor (NWT). The method provides a cylindrical nanostructure with an outside surface axis overlying a substrate surface. The nanostructure includes an insulated semiconductor core. A conductive film is conformally deposited overlying the nanostructure, to function as a gate strap or a combination gate and gate strap. A hard mask insulator is deposited overlying the conductive film and selected regions of the hard mask are anisotropically plasma etched. As a result, a conductive film gate electrode is formed substantially surrounding a cylindrical section of nanostructure. Inadvertently, conductive film reentrant stringers may be formed adjacent the nanostructure outside surface axis, made from the conductive film. The method etches, and so removes the conductive film reentrant stringers.

12 Claims, 5 Drawing Sheets

AFTER DRY ETCH OF OXIDE AND Si

AFTER DRY ETCH OF OXIDE AND Si

AFTER TMAH ETCH

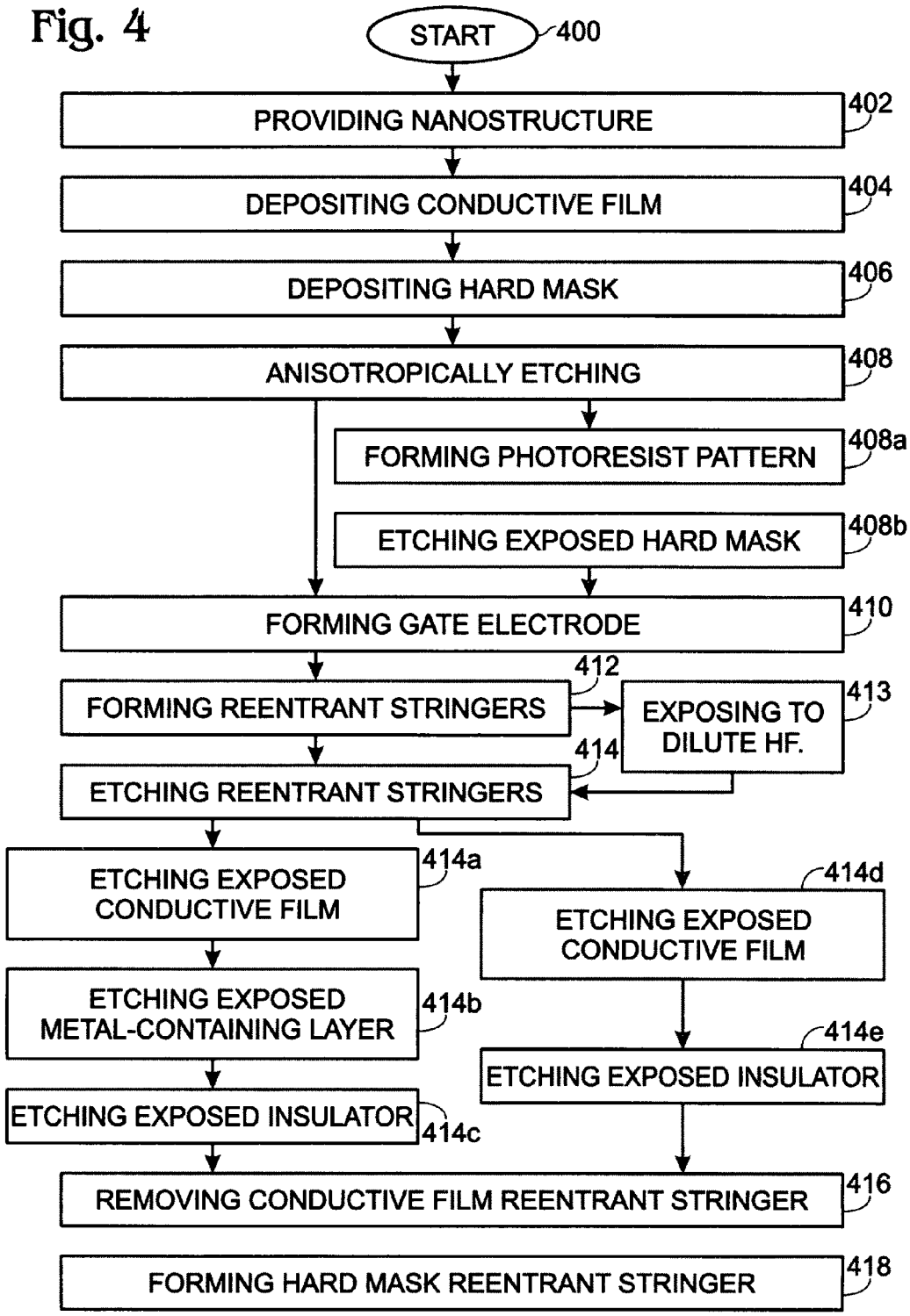

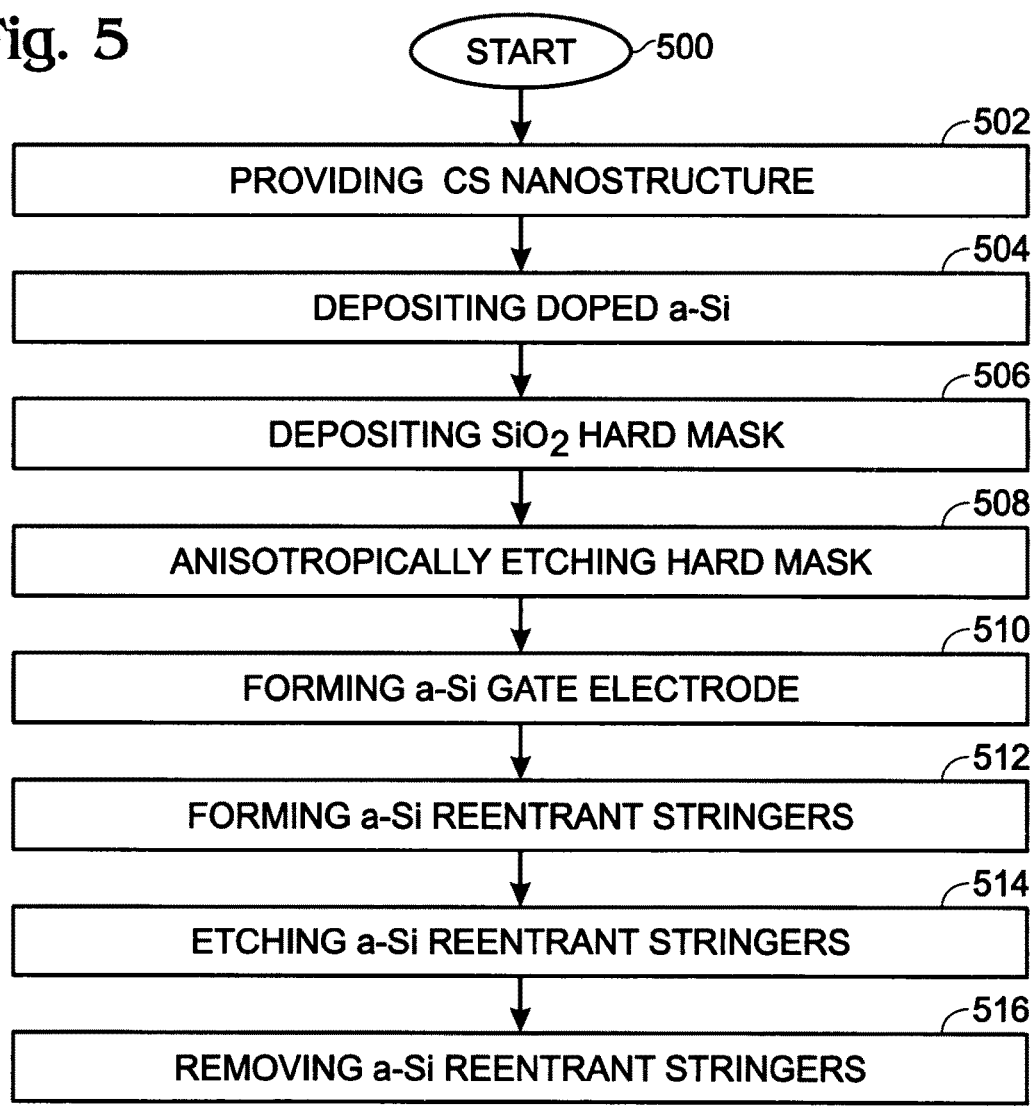

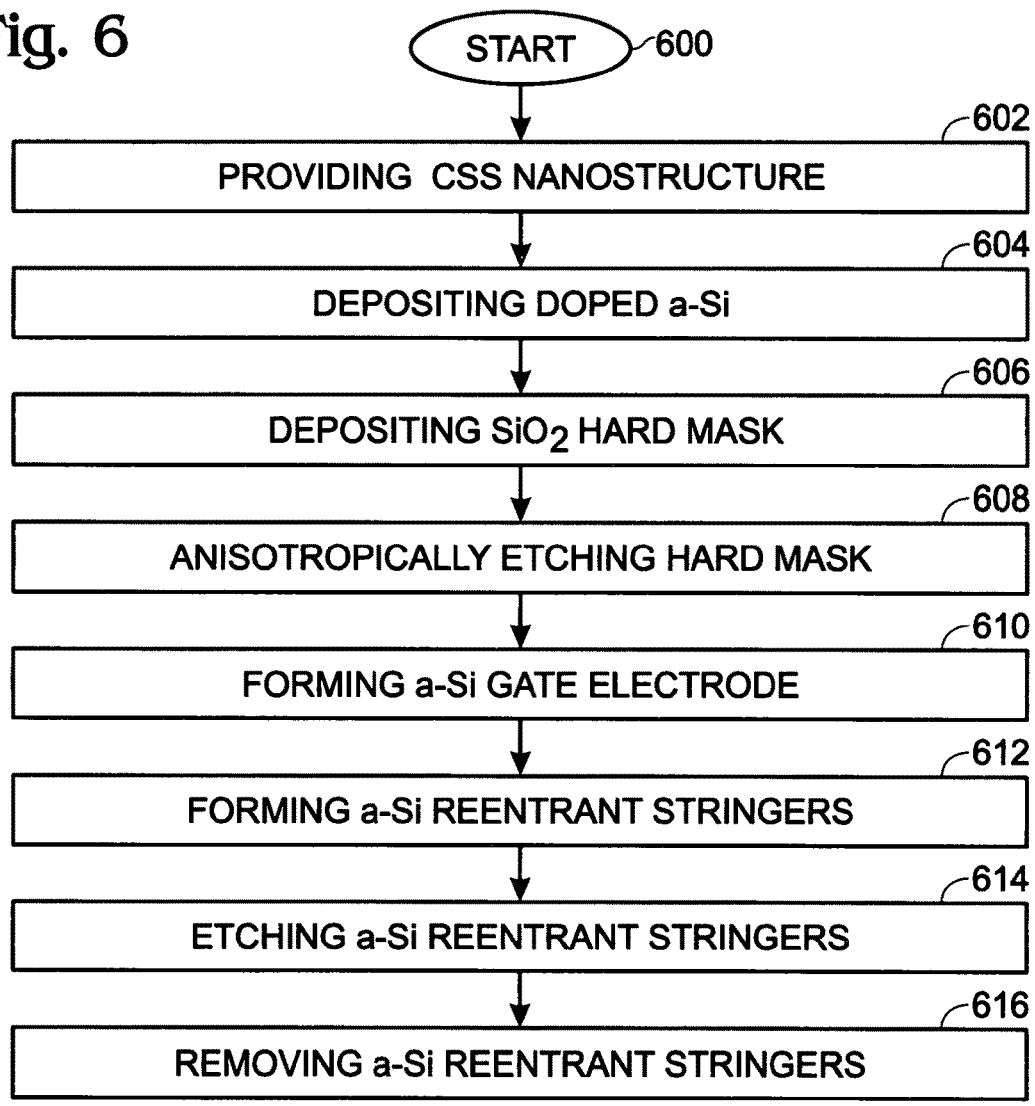

NANOWIRE TRANSISTOR AND METHOD FOR FORMING SAME

BACKGROUND OF THE INVENTION

1. Field of the Invention

This invention generally relates to integrated circuit (IC) fabrication and, more particularly, to a method for fabricating a nanowire transistor (NWT).

2. Description of the Related Art

Nanowire transistors (NWTs) are an important technological advancement that enable the fabrication of high-performance devices on substrates that are sensitive to high process temperatures (e.g., glass or plastic). Nanowires can be pre-processed prior to deposition on the substrate in a way that emulates steps used in conventional integrated circuit technology, including the formation of a thermally grown oxide for the gate insulator layer. After the nanowires are coated on a substrate for processing, a conductive gate layer or gate strap layer is deposited and patterned. The conductive layer is etched to reveal the source and drain regions of the device, which are doped via ion implantation to make the regions electrically conductive. The doping can be made either n-type or p-type, depending on the type of device that is desired. Following the doping of the source and drain regions, the material is thermally activated and an interlayer dielectric is deposited over the entire structure. Contact holes are patterned and opened through the interlayer dielectric to reveal the gate/gate strap, source, and drain. A metal layer is deposited and patterned to make electrical contact to the device electrodes.

Silicon (Si) gate straps are often used in the fabrication of nanowire transistor (NWT) architectures. The gate straps provide a means for contacting the outer shell electrode (e.g., TaAlCN outer shell) for core-shell-shell (CSS) nanostructures, or to provide a gate material for core-shell (CS) nanostructures. Due to the fact that the gate material must have a low resistivity, typically an in-situ doped a-Si material is deposited.

FIG. 1 is a cross-sectional view depicting the Si that remains following an anisotropic etching (prior art). In either of the CSS or CS devices, there is concern for any Si that remains following the standard gate etch step. This Si remains due to the fact that the Si is deposited with a highly conformal CVD process and then etched using an anisotropic plasma etch. Due to the cylindrical shape of the nanostructures, the doped Si material remains along the edges of the wires where it is shadowed from the plasma etch process (i.e., at the reentrant corners along the lower/southern hemicylinder of the wires). These reentrant regions, when filled with doped Si, create "stringers" that may inadvertently connect the gate to either the source or the drain. Since these "stringers" can short the device, it is crucial that they be removed.

It would be advantageous if NWT transistors could be formed without conductive reentrant stringers that can inadvertently short the gate electrode to either the drain or source electrodes.

SUMMARY OF THE INVENTION

The present invention describes a process for removing any conductive reentrant stringers that have inadvertently been formed in a NWT fabrication process.

Accordingly, a method is provided for removing reentrant stringers in the fabrication of a nanowire transistor (NWT). The method provides a cylindrical nanostructure with an outside surface axis overlying a substrate surface. The nanostructure includes an insulated semiconductor core. A conductive film is conformally deposited overlying the nanostructure, to function as a gate strap or a combination gate and gate strap. A hard mask insulator is deposited overlying the conductive film and selected regions of the hard mask are anisotropically plasma etched. As a result, a conductive film gate electrode is formed substantially surrounding a cylindrical section of nanostructure. Inadvertently, conductive film reentrant stringers may be formed adjacent the nanostructure outside surface axis, made from the conductive film. The method etches, and so removes the conductive film reentrant stringers.

In one aspect, the conformally deposited conductive film includes is doped amorphous silicon (a-Si), and the conductive film reentrant stringer are etched by exposure to a diluted tetramethylammonium hydroxide (TMAH) solution. Alternately, the conformally deposited conductive film may be tungsten (W) or tungsten nitride (WN), and the conductive film reentrant stringers are etched through exposure to an SC1 etchant.

Additional details of the above-described NWT fabrication method are provided below.

BRIEF DESCRIPTION OF THE DRAWINGS

FIG. 4 is a flowchart illustrating a method for removing reentrant stringers in the fabrication of a NWT.

FIG. 5 is flowchart illustrating a first variation of the method for removing reentrant stringers in the fabrication of a core-shell NWT.

FIG. 6 is flowchart illustrating a second variation of the method for removing reentrant stringers in the fabrication of a core-shell-shell NWT.

DETAILED DESCRIPTION

The present invention describes a process developed for the removal of the conductive stringers along the length of the nanostructures, outside of the gate region. In a Si stringer example, a post-plasma isotropic wet etch is performed using a dilute, heated tetramethylammonium hydroxide (TMAH) solution. TMAH is a quaternary ammonium salt with the molecular formula $(CH_3)_4NOH$. It is used as an anisotropic etchant of silicon. It can also used as a basic solvent in the development of acidic photoresist in the photolithography process.

In order to break through the native oxide that can quite effectively prohibit the TMAH etch of Si stringers, the material may be first exposed to a 50:1 DI:HF solution. Likewise, in order to avoid removing the Si gate, a $SiO_2$ hard mask may be deposited over the Si material prior to the patterning and etching of the gate. A hard mask sidewall may result that makes removal of the Si stringers slightly more difficult.

Figure 1:
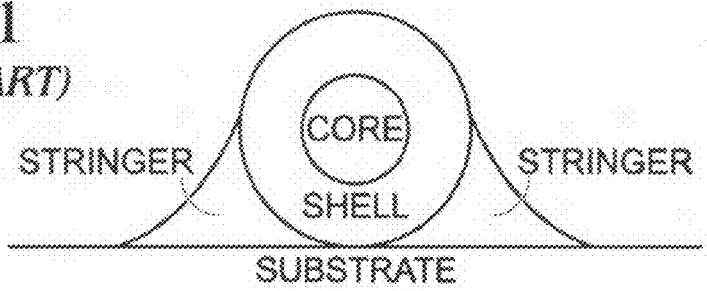
FIG. 1 is a cross-sectional view depicting the Si that remains following an anisotropic etching (prior art).
Figure 2A:
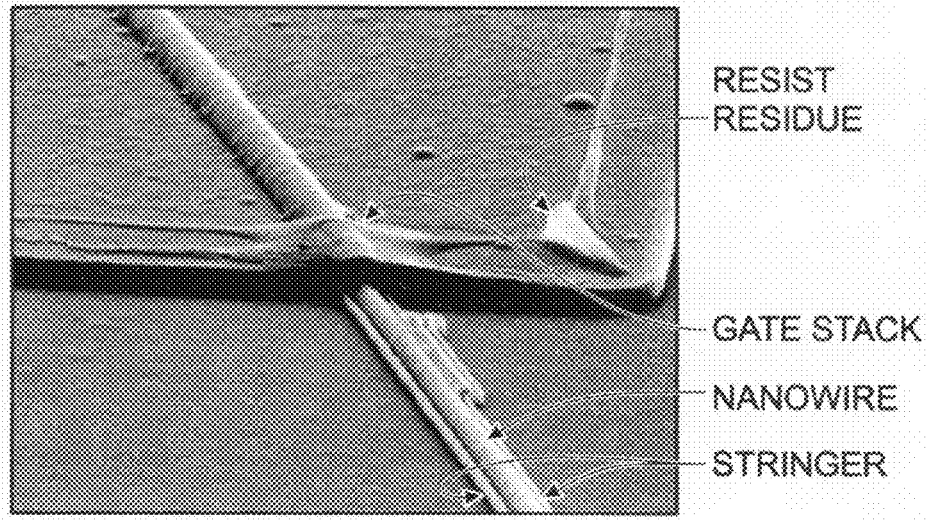
FIGS. 2A and 2B are perspective views of Si stringers before their removal using a TMAH etchant.
Figure 2B:
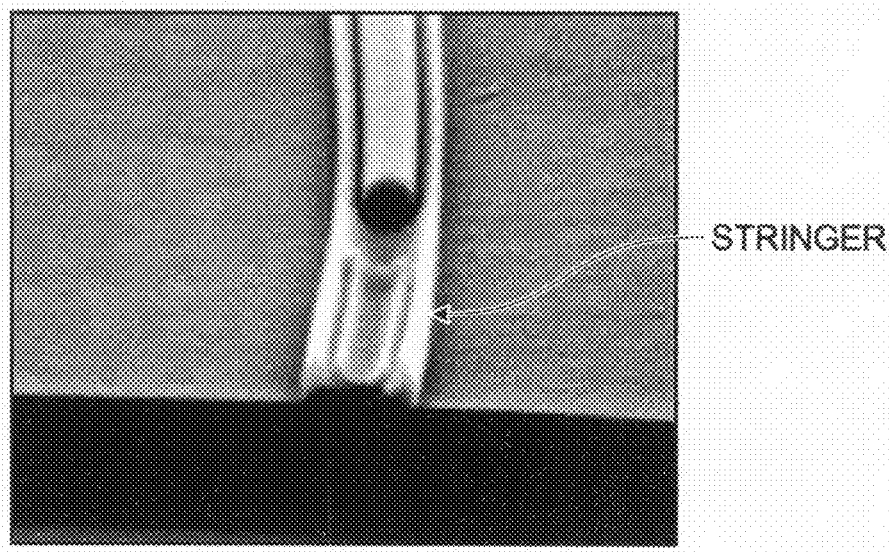

FIGS. 2A and 2B are perspective views of Si stringers before their removal using a TMAH etchant. FIG. 2A depicts Si stringer materials after the anisotropic plasma etch of the gate, and prior to the TMAH isotropic etch. A nanostructure extends from beneath a Si gate stack that is patterned with a $SiO_2$ hard mask. Some residual photoresist exists near the gate region, and stringers extend along the length of the nanostructure. FIG. 2B more clearly shows the Si and SiO$_2$ stringers that remain underlying the nanostructure.

Figure 3A:
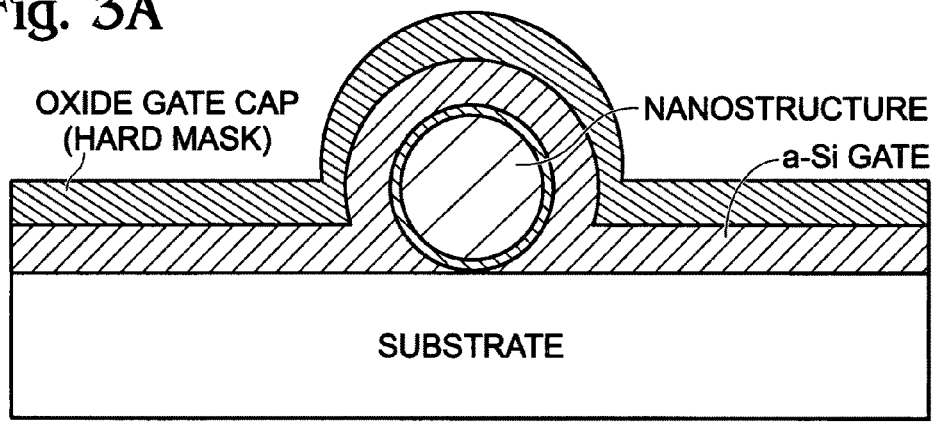
FIGS. 3A through 3C are cross-sectional views depicts steps in the etching and removal of Si stringer material.
Figure 3B:
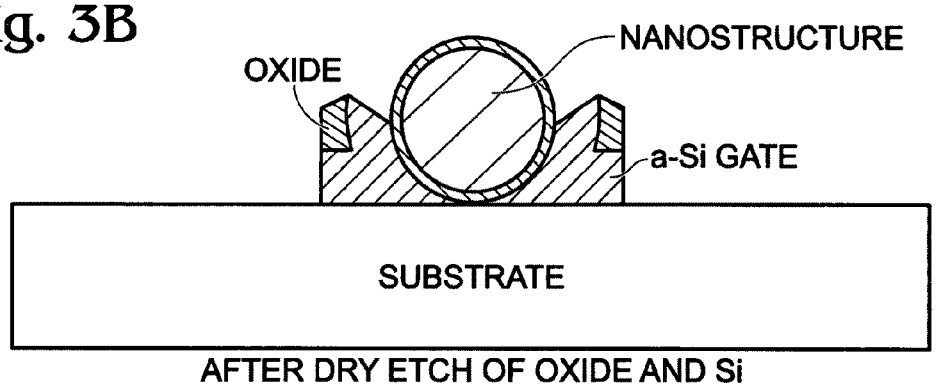
Figure 3C:
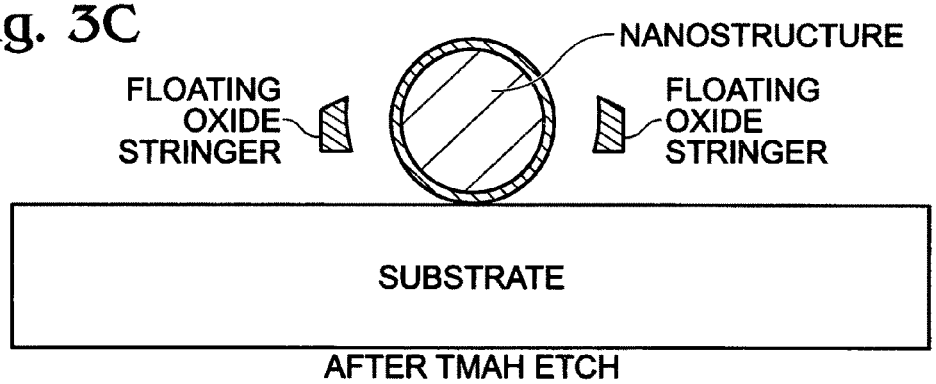

FIGS. 3A through 3C are cross-sectional views depicts steps in the etching and removal of Si stringer material. In FIG. 3A a hard mask has been applied to protect the conductive film (e.g., a-Si) overlying the gate electrode. FIG. 3B depicts the results of an anisotropic etch performed to remove undesired regions of conductive film. FIG. 3C depicts the result of an isotropic etch to remove conductive film stringers. In some cases a (benign) hard mask (e.g., SiO$_2$) stringer results.

The above-described process is especially effective when relatively thick hard masks are used. A standard gate material stack that has been used to good effect is a 100-nm-thick in-situ doped Si film with a 100-nm-thick TEOS cap oxide to protect the Si material from the TMAH.

FIG. 4 is a flowchart illustrating a method for removing reentrant stringers in the fabrication of a NWT. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 400.

Step 402 provides a cylindrical nanostructure with an outside surface axis overlying a substrate surface. The nanostructure includes an insulated semiconductor core. Step 404 conformally deposits a conductive film overlying the nanostructure. Step 406 deposits a hard mask insulator overlying the conductive film. For example, the hard mask insulator may be tetraethoxysilane (TEOS) hard mask. However, other hard mask materials are also known in the art (e.g., silicon nitride). Step 408 anisotropically plasma etches selected regions of the hard mask. Step 410 forms a conductive film gate electrode substantially surrounding a cylindrical section of nanostructure. Step 412 forms conductive film reentrant stringers adjacent the nanostructure outside surface axis, made from the conductive film. Step 414 etches the conductive film reentrant stringers, which are removed in Step 416. Following the removal of the reentrant stringers, conventional NWT processes may be performed to activate the source, drains, and gate regions, and to form electrical contacts to these electrodes.

In one aspect, conformally depositing the conductive film in Step 404 includes depositing doped amorphous silicon (a-Si). Then, etching the conductive film reentrant stringers in Step 414 includes exposing the conductive film reentrant stringers to a diluted TMAH solution. For example, Step 414 may expose the reentrant stringers to 3% TMAH (by weight), at 50° C., for 20 seconds. In another aspect, prior to exposing the conductive film reentrant stringers to TMAH, Step 413 exposes the conductive film reentrant stringers to diluted hydrofluoric (HF) acid. In another aspect, conformally depositing the conductive film in Step 404 includes depositing doped a-Si to a thickness in a range of about 50 to 200 nanometers (nm). Depositing the TEOS hard mask in Step 406 includes depositing the TEOS hard mask to a thickness of greater than 100 nm.

Alternately, Step 404 deposits a conductive film of either tungsten (W) or tungsten nitride (WN). Then, etching the conductive film reentrant stringers in Step 414 includes exposing the conductive film reentrant stringers to an SC1 etchant.

In one aspect, forming conductive film reentrant stringers in Step 412 includes forming reentrant stringers made from a conductive film layer adjacent the nanostructure and a hard mask layer overlying the conductive film layer (see FIG. 3B).

In another aspect, subsequent to etching the conductive film reentrant stringers in Step 414, Step 418 forms floating hard mask stringers.

In one variation, providing the nanostructure in Step 402 includes providing a nanostructure with a semiconductor core material made from a material such as Si, germanium (Ge), carbon-nanotubes, Group III-IV compounds, or Group II-VI compounds.

In a second variation, Step 402 provides a core-shell (CS) nanostructure with a Si core and a Si-containing insulator shell overlying the Si core. Then, forming conductive film reentrant stringers in Step 412 includes forming a Si-containing insulator layer adjacent the nanostructure and a conductive film layer overlying the Si-containing insulator layer. Etching the conductive film reentrant stringers in Step 414 includes etching the Si-containing insulator layer, subsequent to etching the conductive film.

Continuing the CS example, anisotropically plasma etching selected regions of the hard mask in Step 408 includes substeps. Step 408a forms a patterned photoresist mask overlying the hard mask. Step 408b etches exposed regions of hard mask, exposing underlying regions of conductive film. Etching the conductive film reentrant stringers includes the following substeps. Step 414d etches the exposed regions of the conductive film, exposing an underlying Si-containing insulator layer. Step 414e etches the exposed regions of the Si-containing insulator layer.

In a third variation, Step 402 provides a core-shell-shell (CSS) nanostructure with a Si core, a Si-containing insulator shell overlying the Si core, and a metal-containing conductor shell overlying the Si-containing insulator shell. Forming the conductive film reentrant stringers in Step 412 includes forming Si-containing insulator layer adjacent the nanostructure core, a conductive film layer overlying the Si-containing insulator, and a metal-containing conductor layer overlying the Si-containing insulator layer. Then, etching the conductive film reentrant stringers in Step 414 includes etching the metal-containing conductor layer and Si-containing insulating layer, subsequent to etching the conductive film.

Continuing the CSS example, anisotropically plasma etching selected regions of the hard mask in Step 408 includes substeps. Step 408a forms a patterned photoresist mask overlying the hard mask. Step 408b etches exposed regions of hard mask, exposing underlying regions of conductive film. Etching the conductive film reentrant stringers includes the following substeps. Step 414a etches the exposed regions of the conductive film, exposing an underlying nanostructure metal-containing layer. Step 414b etches the exposed regions of the metal-containing layer, exposing an underlying Si-containing insulator layer. Step 414c etches the exposed regions of the Si-containing insulator layer.

Although not specifically shown in the figure, subsequent etch steps would be performed to remove the outer shell metal-containing material in the S/D regions. Depending on the gate strap/stringer material, a single isotropic etch might be useable to etch both the CSS conductive outer shell and the conductive film. For example, if a W or WN gate strap (conductive film) is used, an SC1 solution (NH$_4$OH:H$_2$O$_2$:H$_2$O), can be used to attack both the conductive outer shell and the gate strap. Then, the inner shell (Si-containing insulator) is etched in regions overlying the S/D regions. The S/D regions can then be finished using appropriate doping processes.

FIG. 5 is flowchart illustrating a first variation in the method for removing reentrant stringers in the fabrication of a core-shell-shell NWT. The method starts at Step 500. Step 502 provides a cylindrical CS nanostructure with a Si core and a Si-containing insulator shell overlying the Si core. The CS nanostructure has an outside surface axis overlying a substrate surface. Step 504 conformally deposits a doped amorphous Si (a-Si) film overlying the CS nanostructure. Step 506 deposits a silicon dioxide hard mask insulator overlying the conductive (a-Si) film. Step 508 anisotropically plasma etches selected regions of the hard mask. Step 510 forms an a-Si film gate electrode substantially surrounding a cylindrical section of nanostructure. Step 512 forms reentrant stringers adjacent the nanostructure outside surface axis, made from the a-Si film. Step 514 etches the a-Si film reentrant stringers. Step 516 removes the a-Si film reentrant stringer.

FIG. 6 is flowchart illustrating a second variation in the method for removing reentrant stringers in the fabrication of a core-shell-shell NWT. The method starts at Step 600. Step 602 provides a cylindrical CSS nanostructure with a Si core, a Si-containing insulator shell overlying the Si core, and a metal-containing shell overlying the Si-containing insulator shell. The CSS nanostructure has an outside surface axis overlying a substrate surface. Step 604 conformally deposits a doped a-Si film overlying the CSS nanostructure. Step 606 deposits a silicon dioxide hard mask insulator overlying the conductive a-Si film. Step 608 anisotropically plasma etches selected regions of the hard mask. Step 610 forms an a-Si film gate electrode substantially surrounding a cylindrical section of nanostructure. Step 612 forms reentrant stringers adjacent the nanostructure outside surface axis, made from the a-Si film. Step 614 etches the a-Si film reentrant stringers. Step 616 removes the a-Si film reentrant stringer.

A method has been provided for the removal of conductive film reentrant stringers that are inadvertently formed in the fabrication of an NWT. Some particular nanostructures, materials, and specific process orderings has been presented as examples to illustrate the invention. However, the invention is not limited to just these examples. Other variations and embodiments of the invention will occur to those skilled in the art

We claim:

1. In the fabrication of a nanowire transistor (NWT), a method for removing reentrant stringers, the method comprising:
   providing a cylindrical nanostructure with an insulator shell having an outside surface with a lower hemisphere overlying a substrate surface, the nanostructure including a semiconductor core surrounded by the insulator shell;
   conformally depositing a conductive film overlying the nanostructure with a reentrant section underlying the insulator shell outside surface lower hemisphere;
   depositing a hard mask insulator overlying the conductive film, with a reentrant section adjacent the conductive film reentrant section;
   anisotropically plasma etching selected regions of the hard mask;
   forming a conductive film gate electrode substantially surrounding a cylindrical section of the insulator shell;
   forming reentrant stringers from the reentrant section of the conductive film layer underlying the insulator shell outside surface lower hemisphere, and from the reentrant section of the hard mask insulator adjacent the reentrant section of the conductive film;
   isotropically etching the reentrant section of the conductive film; and,
   removing the conductive film portion of the reentrant stringers.

2. The method of claim 1 wherein conformally depositing the conductive film includes depositing doped amorphous silicon (a-Si);
   wherein isotropically etching the reentrant section of the conductive film includes exposing the reentrant stringers to a diluted tetramethylammonium hydroxide (TMAH) solution.

3. The method of claim 2 exposing the reentrant stringers to diluted TMAH includes exposing the reentrant stringers to 3% TMAH (by weight), at 50° C., for 20 seconds.

4. The method of claim 2 further comprising:
   prior to exposing the reentrant stringers to TMAH, exposing the reentrant stringers to diluted hydrofluoric (HF) acid.

5. The method of claim 1 further comprising:
   subsequent to isotropically etching the reentrant section of the conductive film, forming floating hard mask stringers.

6. The method of claim 1 wherein providing the nanostructure includes providing a nanostructure with a semiconductor core material selected from a group consisting of silicon (Si), germanium (Ge), carbon-nanotubes, Group III-IV compounds, and Group II-VI compounds.

7. The method of claim 1 wherein providing the nanostructure includes providing a core-shell (CS) nanostructure with a Si core and a Si-containing insulator shell surrounding the Si core;
   wherein conformally depositing the conductive film includes forming a Si-containing insulator layer with a reentrant section underlying the Si-containing insulator shell lower hemisphere and the reentrant section of the conductive film adjacent to, and overlying the reentrant section of the Si-containing insulator layer; and,
   wherein isotropically etching the reentrant section of the conductive film includes etching the reentrant section of the Si-containing insulator layer, subsequent to etching the reentrant section of the conductive film.

8. The method of claim 7 wherein anisotropically plasma etching selected regions of the hard mask includes:
   forming a patterned photoresist mask overlying the hard mask;
   etching exposed regions of hard mask, exposing underlying regions of conductive film; and,
   wherein etching the reentrant section of the conductive film includes:
      etching the exposed regions of the reentrant section of the conductive film, exposing an underlying reentrant section of the Si-containing insulator layer; and,
      etching the exposed regions of the Si-containing insulator layer.

9. The method of claim 1 wherein depositing the hard mask insulator includes depositing a tetraethoxysilane (TEOS) hard mask.

10. The method of claim 9 wherein conformally depositing the conductive film includes depositing doped a-Si to a thickness in a range of about 50 to 200 nanometers (nm); and,
   wherein depositing the TEOS hard mask includes depositing the TEOS hard mask to a thickness of greater than 100 nm.

11. In the fabrication of a core-shell nanowire transistor (NWT), a method for removing reentrant stringers, the method comprising:
   providing a cylindrical core-shell (CS) nanostructure with a silicon (Si) core and a Si-containing insulator shell surrounding the Si core, the CS nanostructure having an insulator shell outside surface lower hemisphere overlying a substrate surface;

conformally depositing a doped amorphous Si (a-Si) film overlying the CS nanostructure, forming a reentrant section of the a-Si film underlying the insulator shell outside surface lower hemisphere;

depositing a silicon dioxide hard mask insulator overlying the a-Si film, forming a reentrant section of the hard mask insulator adjacent to the reentrant section of the a-Si film;

anisotropically plasma etching selected regions of the hard mask;

forming an a-Si film gate electrode substantially surrounding a cylindrical section of the insulator shell;

forming reentrant stringers made from the reentrant section of the a-Si film, and from the reentrant section of the silicon dioxide hard mask insulator;

isotropically etching the reentrant section of the a-Si film; and, removing the reentrant section of the a-Si film.

12. In the fabrication of a nanowire transistor (NWT), a method for removing reentrant stringers, the method comprising:

providing a cylindrical nanostructure with; an insulator shell outside surface lower hemisphere overlying a substrate surface, the nanostructure including a semiconductor core surrounded by the insulator shell;

conformally depositing a conductive film overlying the nanostructure with a reentrant section underlying the insulator shell outside surface lower hemisphere;

depositing a hard mask insulator overlying the conductive film, with a reentrant section adjacent the conductive film reentrant section;

anisotropically plasma etching selected regions of the hard mask;

forming a conductive film gate electrode substantially surrounding a cylindrical section of the insulator shell;

forming reentrant stringers from the reentrant section of the conductive film layer underlying the insulator shell outside surface lower hemisphere, and from the reentrant section of the hard mask insulator adjacent the reentrant section of the conductive film;

isotropically etching the reentrant section of the conductive film;

removing the conductive film portion of the reentrant stringers; and, forming floating hard mask stringers.

* * * * *